United States Patent [19]

Arcus

[11] Patent Number: 4,890,013

[45] Date of Patent: Dec. 26, 1989

[54] CIRCUIT FOR SENSING VOLTAGES BEYOND THE SUPPLY VOLTAGE OF THE SENSING CIRCUIT

[75] Inventor: Christopher G. Arcus, San Jose, Calif.

[73] Assignee: IXYS Corporation, San Jose, Calif.

[21] Appl. No.: 208,310

[22] Filed: Jun. 17, 1988

[51] Int. Cl.[4] .............................................. H03K 5/24
[52] U.S. Cl. .................................... 307/355; 307/362
[58] Field of Search ......................... 307/355, 350, 362

[56] References Cited

U.S. PATENT DOCUMENTS

| | | | |
|---|---|---|---|
| 4,593,380 | 6/1986 | Kocher et al. | 364/900 |
| 4,749,880 | 6/1988 | Kobatake | 307/355 |
| 4,751,405 | 6/1988 | Bufano, Jr. et al. | 307/355 |
| 4,754,169 | 6/1988 | Morris | 307/355 |

Primary Examiner—John Zazworsky
Attorney, Agent, or Firm—Townsend and Townsend

[57] ABSTRACT

A voltage sensing circuit wherein voltages that appear at first and second sensing nodes are converted into first and second currents which are proportional to their respective voltages. A comparing circuit compares the first current to the second current and generates a difference current proportional to the difference between the magnitudes of the two currents. A rectifier circuit rectifies the difference current, and the difference current is added to a reference current. The combined current is applied to the first input terminal of a comparator. The second input terminal of the comparator is coupled to a reference voltage, and the comparator indicates when the voltage created from the combined currents exceeds the reference voltage.

18 Claims, 5 Drawing Sheets

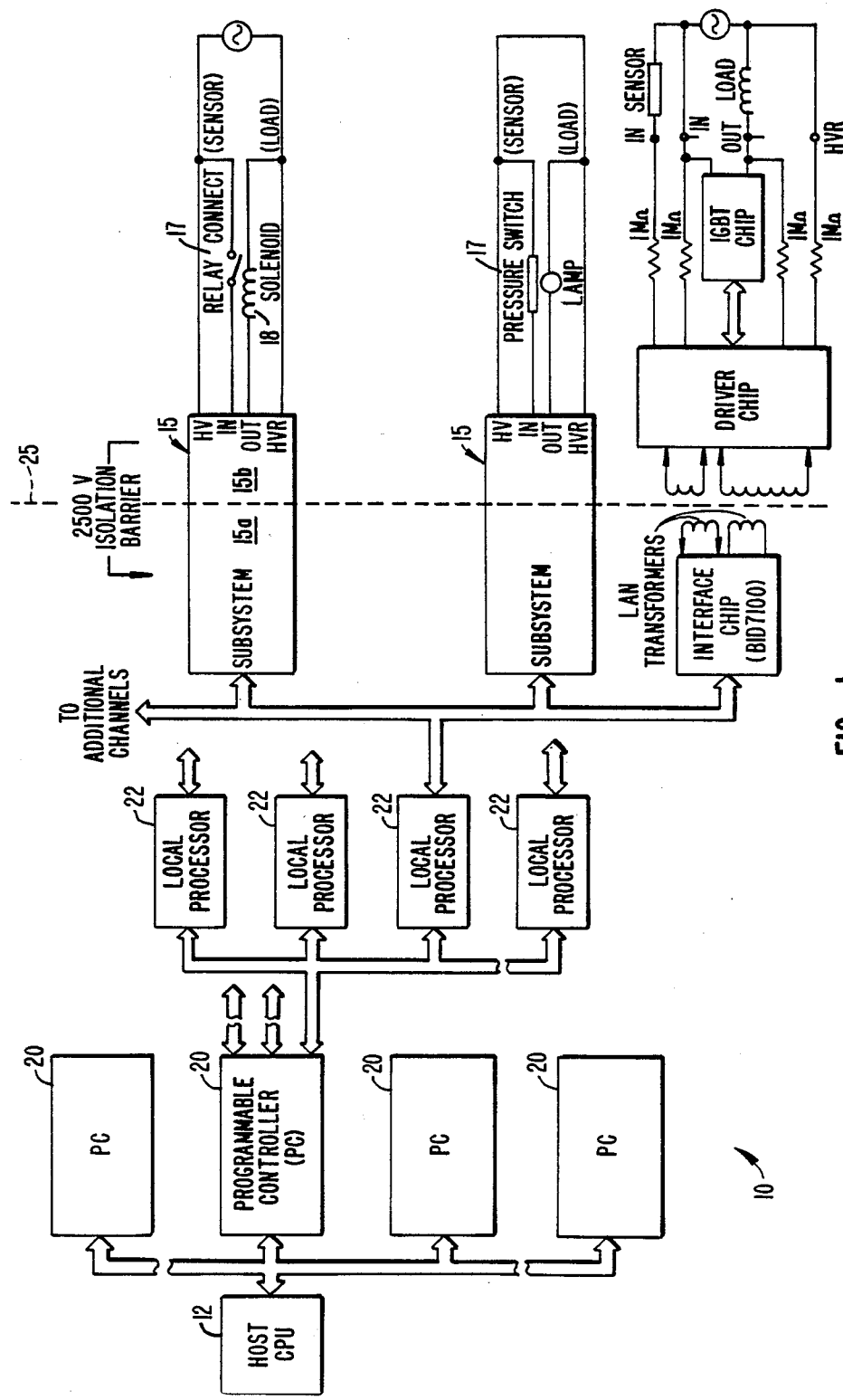
FIG._1.

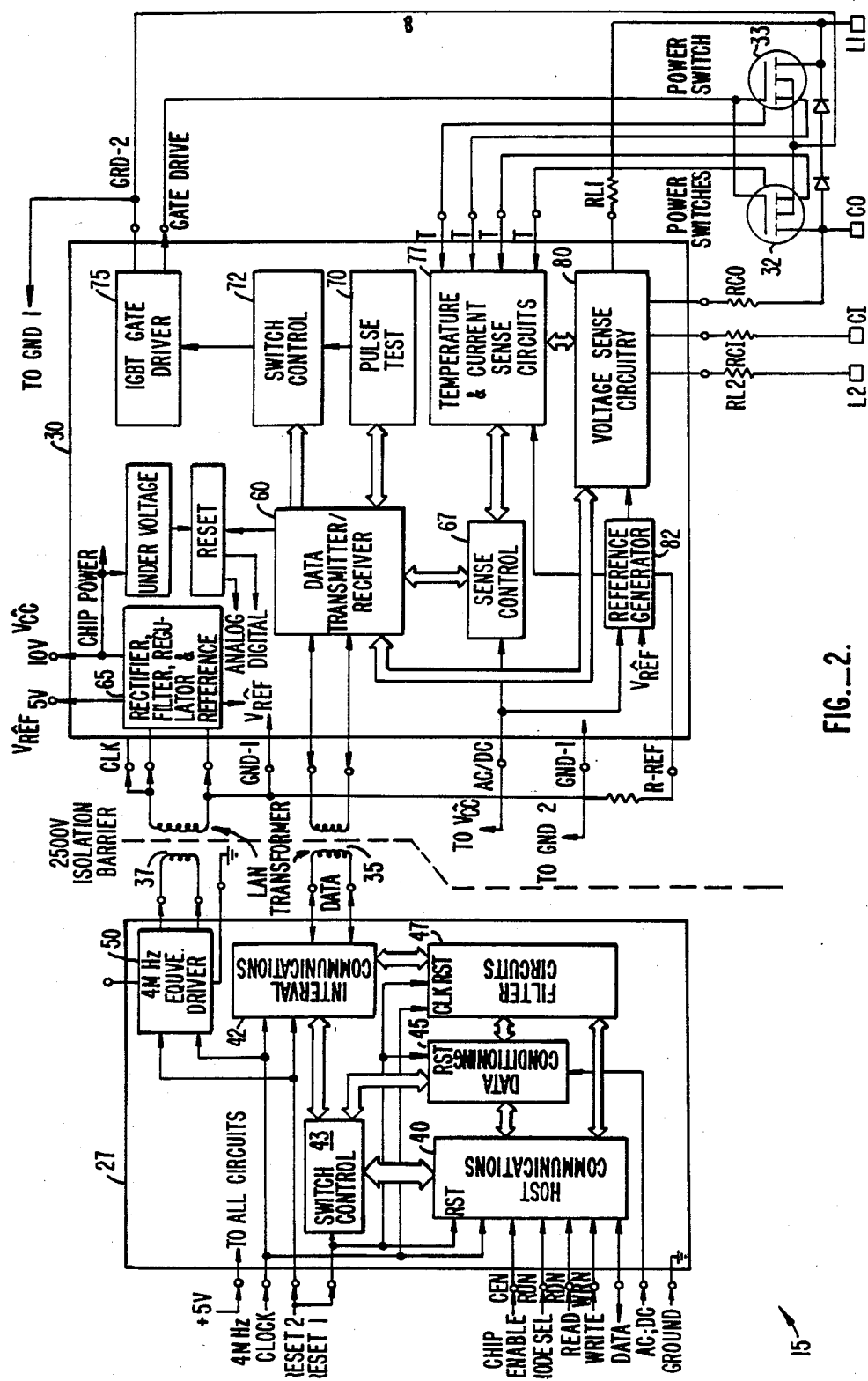
FIG._2.

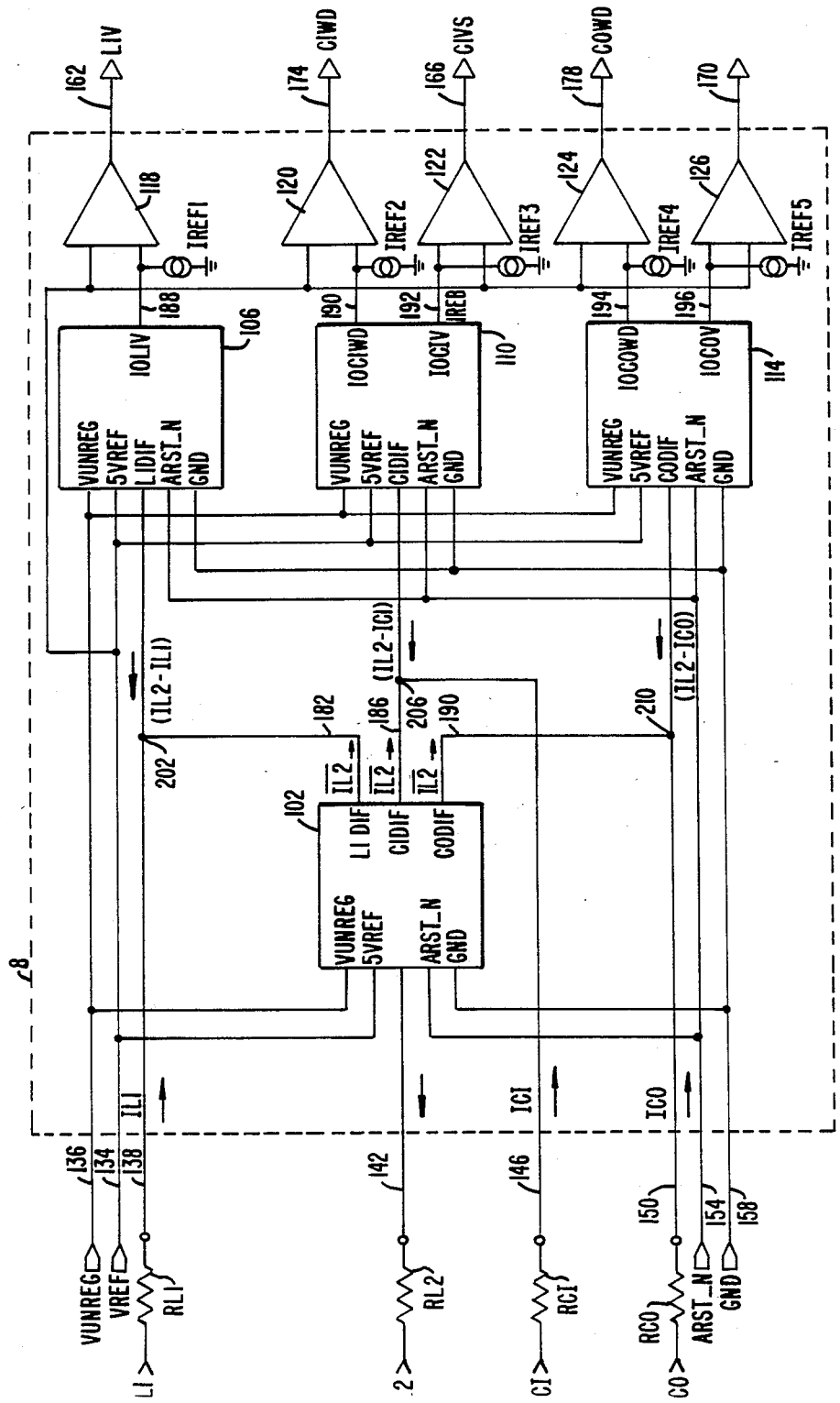
FIG._3.

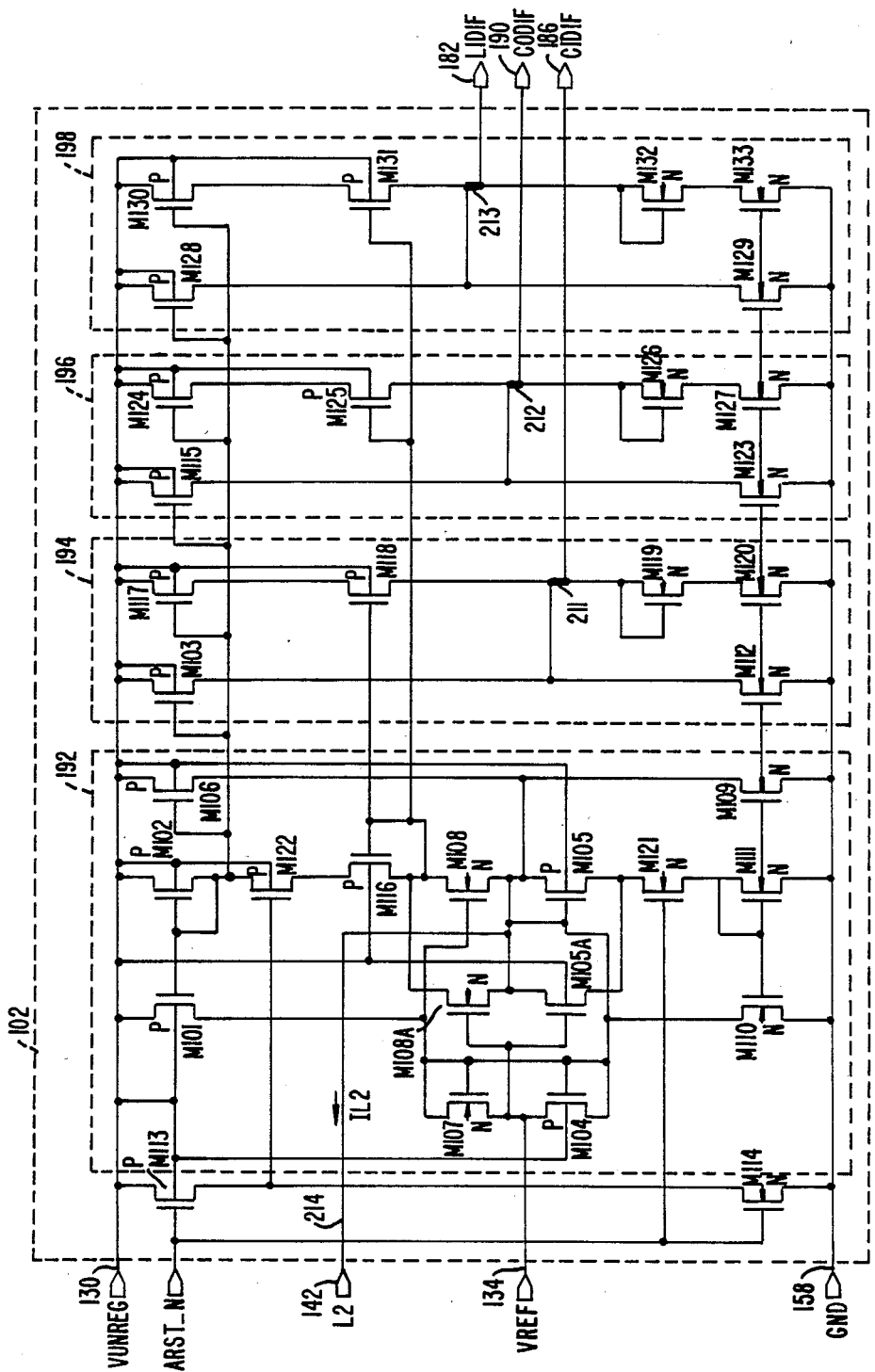
FIG.—4.

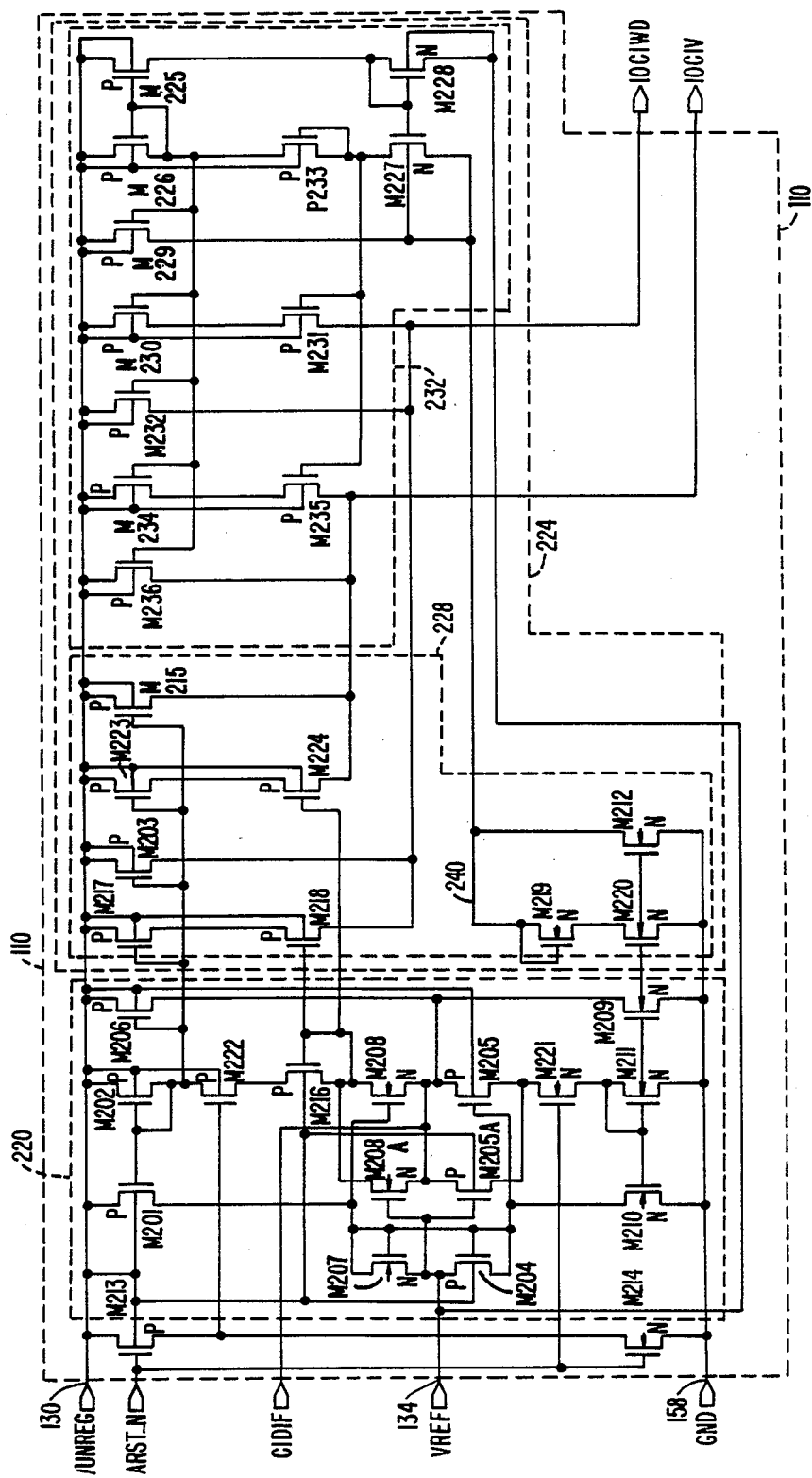
FIG._5.

CIRCUIT FOR SENSING VOLTAGES BEYOND THE SUPPLY VOLTAGE OF THE SENSING CIRCUIT

BACKGROUND OF THE INVENTION

1. Field Of The Invention

The invention relates generally to voltage sensing circuits for power control and power management in applications such as intelligent power supplies and industrial automation systems, and, more specifically, to a circuit for sensing voltages beyond the voltage limits of the power supplies which operate the components in the circuit.

2. Description Of The Relevant Art

Reduced to bare essentials, an industrial process may be regarded as having a number of sensors and loads that correspond to input and output variables for a process control computer system. The sensors provide input values representative of the state of the process at a given time: the loads respond to output values, and thereby control various aspects of the process. Typical sensors include relay contacts, proximity switches, and pressure switches. Typical loads include contractor coils of starters for large motors, solenoid valves, relays, lamps, and small motors. A process may have several hundred to several thousand input sensors and loads that must be serviced at very frequent intervals.

A typical computer system for automating an industrial process contains a number of general and special purpose computers. The system monitors input variables from the process, performs suitable logical manipulations on the inputs, and updates output variables for the process. The computer system is usually organized hierarchically. A host processor, typically a minicomputer or a mainframe, communicates with a number of programmable controllers, each of which communicates with a number of power control subsystems through a number of local processors. A programmable controller is a processor designed specifically to perform logical manipulations on a large number of binary inputs on a cyclical basis. The local processors have as their primary function the efficient transfer of data between the power control subsystems and the working memories of the programmable controllers. The power control subsystems provide the interface between the local processors and the various sensors and loads.

In order to provide operational information to the system monitor load parameters must be sensed and communicated to the host processor. The load parameters typically comprise voltages which exist at various load points throughout the system. A common test point is a power switch (FET or IGBT) which switches power to the load. One method of sensing voltages employs the use of operational amplifiers with suitable feedback elements. Op amps typically operate from power supplies which generate approximately 5 to 12 volts and, for each parameter that is to be tested, require 4 resistors which must be ratio-matched in pairs: one for the feedback loop, one for the reference voltage, and one for each of the two input terminals of the op amp for scaling the voltages from the sensors to the reference voltages set by the reference resistor. The latter are required because operational amplifiers cannot accept signals beyond their supply voltage.

In op amp-based sensing circuits, dynamic range is limited because of the requirement of scaling the system to voltages and the inherent error of the resistors. Additionally, each resistor typically must be placed externally, and for every new parameter that is to be tested, four new resistors are required. Furthermore, when voltages at the power switch are being monitored, the setup of the operational amplifier depends on whether the op amp is placed on the high or low side of the line. Op amp configurations for high-side op amp grounding are not easily interchangeable with op amp configurations for low-side op amp grounding. Finally, separate operational amplifiers ordinarily must be provided for AC and DC signals. Consequently, systems which employ operational amplifiers to sense voltages are severely limited in flexibility.

SUMMARY OF THE INVENTION

The present invention is directed to a circuit for sensing voltages that may be beyond the voltage limits of the power supply which operate the sensing circuit. The circuit according to the present invention may be used for both AC and DC operations, is independent of the location of the circuit relative to the power lines (i.e., it can operate on either the high or low side of the power line). makes it very easy to change and set reference voltages, provides a very wide dynamic range of sensed voltages, and requires the addition of only one resistor for each additional voltage that is to be sensed.

In one embodiment of the invention, the voltages that appear at first and second sensing nodes are converted into first and second currents that are proportional to their respective voltages. A comparing circuit compares the first current to the second current and generates a difference current proportional to the difference between the magnitudes of the two currents. A rectifying circuit rectifies the difference current, and the difference current is added to a reference current. By rectifying the difference current before adding it to the reference current, the circuit may be used with either AC or DC voltages and with either high- or low-side power switches. The combined current is applied to the first input terminal of a comparator. The second input terminal of the comparator is coupled to a reference voltage,. and the comparator indicates when the voltage created from the combined currents exceeds the reference voltage. Because the comparison is scaled to current, only one resistor must be added for each sensed voltage, and the dynamic range is substantially increased.

BRIEF DESCRIPTION OF THE DRAWINGS

FIG. 1 is a high level block diagram illustrating the hierarchical structure of a computer system for controlling an automated industrial process.

FIG. 2 is a detailed block diagram of a power control subsystem that interfaces the local processors to the drivers and sensors while providing electrical isolation.

FIG. 3 is a more detailed block diagram of an embodiment of the voltage sensing circuit.

FIG. 4 is a schematic diagram of the difference circuit shown in FIG. 3.

FIG. 5 is a schematic diagram of a rectification circuit shown in FIG. 4.

DETAILED DESCRIPTION OF THE PREFERRED EMBODIMENT

The present invention is drawn to a voltage-sensing circuit capable of sensing voltages beyond the voltage limits of the power supply which drives the components in the sensing circuit. As aid to understanding the environment in which the invention operates, a general description of a factory automation system will be set forth below.

OVERVIEW OF COMPUTER SYSTEM

FIG. 1 is a high level block diagram of a factory automation computer system. The system has a tree-like configuration with a host processor 12 (typically a mainframe) at the root and a large number of power control subsystems 15 (with associated sensors 17 and loads 18) at the ends of the branches. Host processor 12 and power control subsystems 15 are connected by a network of programmable controllers 20 and local processors 22. Programmable controllers 20 are special purpose processors optimized for performing logical manipulations on large numbers of binary variables. Each programmable controller communicates with a number (e.g., 8 or 16) of local processors, each of which communicates with a number (e.g., 8 or 16) of power control subsystems.

Each power control subsystem 15 includes a system-side portion 15a and a load-side portion 15b in communication across a 2500-volt isolation barrier 25. During operation, signals from the local processor continuously update the command to apply power to, or remove it from, the load. Likewise, diagnostic data from the sensor is continuously communicated to the local processor.

OVERVIEW OF POWER CONTROL SUBSYSTEM

FIG. 2 is a detailed block diagram of one of power control subsystems 15. In a preferred implementation, subsystem 15 comprises a pair of CMOS chips, referred to as system interface chip 27 and load interface chip 30, a pair of MOS power switching devices 32 and 33, one or two isolation transformers, referred to as data transformer 35 and clock transformer 37, and a small number of other discrete components.

System interface chip 27 is a 5-volt CMOS chip which operates on the controller/processor/system side of isolation barrier 25, and it communicates with the host system. Pinout connections include DATA, AC/DC. WRITE, READ, RUN/$\overline{\text{PGM}}$, CHIP ENABLE, RESET, and CLOCK, as well as terminals for the transformers and voltage and ground terminals. System interface chip 27 includes host communication circuitry 40, internal communications circuitry 42, switch control circuitry 43, data conditioning circuitry 45, filter circuits 47, and a clock driver 50.

Host communications circuitry 40 provides a bidirectional serial communication link on the DATA line with a protocol easily implemented by most microprocessors. During normal operation, with the RUN,$\overline{\text{PGM}}$ HIGH and CHIP ENABLE LOW, the host communication circuitry receives a 3-bit serial command word on the DATA line. Pulses on the WRITE line clock the data bits into the chip providing a handshake. The data words are analyzed and, if their pattern or number of bits is incorrect, the data is rejected and the host informed. Similarly. 8-bit status words are transmitted to the host when appropriate handshake clock pulses appear on the READ line. In the programming mode, with RUN/e,ovs/PGM/ , LOW, 7-bit serial words are transmitted to chip 27 to set the subsystem's default conditions, sense input's set points, and filter time constants, and verification words are returned to the local processor.

Internal communications circuitry 42 is responsible for communicating data across the isolation barrier to load interface chip 30. The link with the load interface chip is via data transformer 35, using Manchester encoding. Internal communications circuitry 42 encodes checked and processed data received from the host, adds a parity bit, and sends the data at 600 Kilobaud to data transformer 35, and hence across the barrier.

Clock driver 50 derives its timing from the CLOCK input (e.g., 4 MHz) and communicates a version of this signal to clock transformer 37, and hence to load interface chip 30. As will be discussed below, the clock signal which is transmitted across clock transformer 37 provides both a clock signal and power to load interface chip 30.

Load interface chip 30 is an 18-volt CMOS chip which operates in conjunction with a pair of MOS switching devices 32 and 33. These are preferably insulated gate bipolar transistors (IGBT's) which, while slower than power MOSFET's, are more rugged and less expensive for a given current carrying capability. Two IGBT's are used for controlling AC power, while only one IGBT is needed for controlling DC power. The load interface chip includes data transmitting/receiving circuitry 60, power circuitry 65, sense control circuitry 67, pulse test circuitry 70, switch control circuitry 72, an IGBT gate driver 75, temperature and current sense circuitry 77, voltage sense circuitry 80, and a voltage reference generator 82.

Data transmitting/receiving circuitry 60 is coupled to the secondary side of data transformer 35 to provide the basic data communication across the isolation barrier. It decodes the incoming data signals, but checks parity before latching. Each byte is transmitted at least twice. Each incoming byte is compared with its predecessor, and its structure is checked for compliance with the Manchester structure. Similar checking occurs in the reverse direction. Watchdog timers on both chips 27 and 30 alert the subsystem to communication link failure, and put it in a programmed default condition.

Power circuitry 65 is coupled to the secondary of clock transformer 37, and includes on-chip rectifiers, filters, regulators, and references to provide power to the remaining portions of the chip. The 5-volt signal from clock driver 50 on chip 27 is stepped up by clock transformer 37 to a 13–14 volt peak-to-peak waveform. This is rectified and used to develop a 10-volt supply voltage for chip 30 and a 5-volt reference (via voltage reference generator 82) to set the trip points for current and voltage sensing circuitry 77 and 80.

Switch control circuitry 72 and IGBT gate driver 75 control the gates on the IGBT's. Switch control circuitry 72 is preprogrammed to call for "switch open," "switch closed," or "no change" when the subsystem goes into a default condition. Gate driver 75 can handle capacitive loads up to 5000 pf.

Temperature and current sense circuitry 77 provides signals from temperature sensing diodes and current mirrors on the IGBT's. The current sense trip point can be programmed, but the temperature trip point is fixed. When the permissible die temperature or maximum selected current of either switch is exceeded, it is turned off within two microseconds and the host notified. Temperature and current sense circuitry 77 has the ability to accurately sense currents less than 50µA, as well as large currents of 40A or more.

Four lines. designated LI, CO, CI, and L2, connect chip 30 and the IGBT's to the load and high voltage line. LI ties the line to one side of the IGBT switch, and CO ties the other side of the IGBT switch to the load. CI connects to the contact of the device sensing load status and through it, if closed, to the line (e.g.. AC common). L2 connects to the low side of the line. Four 1-megohm resistors link the four lines to corresponding inputs on voltage sense circuitry 80 where they provide the load status sense inputs. Current difference circuitry in the voltage sense circuitry 80 senses line voltage, customer input voltage, and customer output voltage.

VOLTAGE SENSING CIRCUITRY

FIG. 3 is a more detailed block diagram of voltage sense circuitry 80 of FIG. 2. As shown therein, voltage sense circuitry 80 comprises an L2 current generating circuit 102, an L1 processing circuit 106, a CI processing circuit 110, a CO processing circuit 114, and comparators 118, 120, 122, 124, and 126. Voltage sense circuitry 80 is coupled for receiving an unregulated voltage from power circuitry 65 on a VUNREG line 130, a 5-volt reference voltage from voltage reference generator 82 on a VREF line 134, a line side (L1) voltage through an L1 line 138 and a resistor RL1, a common side (L2) voltage through an L2 line 142 and a resistor RL2, a customer-input (CI) voltage through a CI line 146 and a resistor RCI, a customer-output (CO) voltage through a CO line 150 and a resistor RCO, reset signals over an ARST-N line 154, and a floating power supply ground potential over a GND line 158. From these signals, voltage sense circuitry 80 produces an LIV signal on an LIV line 162 for indicating when line L1 is at a prescribed voltage relative to line L2, a CIVS signal on a CIVS line 166 for indicating when the customer input voltage is at a prescribed voltage relative to line L2, a COVS signals on a COVS line 170 for indicating when the customer output has attained a prescribed voltage relative to line L2, a CIWD signal on a CIWD line 174 for indicating a possible open-wire case on the customer input line, and a COWD signal on a COWD line 178 for indicating a possible open-wire condition on the customer output line.

L2 current generating circuit 102 causes the voltage on L2 line 142 to match the reference voltage (e.g., 5 volts). and hence creates a voltage drop across RL2. This, in turn, creates a current IL2 proportional to the L2 voltage. L2 current-generating circuit 102 thereafter inverts the sense of current IL2, and generates currents $\overline{IL2}$ on lines 182, 186, and 190. Each $\overline{IL2}$ current on lines 182, 186, and 190 flows toward an $\overline{L2}$/LI summing node 202, an $\overline{L2}$/CI summing node 206, and an $\overline{L2}$/CO summing node 210, respectively. At the same time, L1 processing circuit 106, CI processing circuit 110, and CO processing circuit 114 cause the voltages on L1 line 138, CI line 146, and CO line 150, respectively, to match the reference voltage for creating potential drops across resistors RL1, RCI, and RCO. respectively. This produces currents IL1, ICI, and ICO. The respective currents are summed at summing nodes 202, 206, and 210. Since the sum of currents at a node equals zero, the summed currents at $\overline{L2}$/L1 summing node 202 cause L1 processing circuit 106 to generate an IL1DIF difference current equal to (IL2-IL1) flowing toward $\overline{L2}$/L1 summing node 202. Similarly, CI processing circuit 110 generates an ICIDIF difference current equal to (IL2-ICI), and CO processing circuit 114 generates an ICODIF difference current equal to (IL2-ICO). The processing circuits 106 110 and 114 also mirror and rectify the resulting difference currents. The rectified difference currents then are communicated to one input terminal of comparators 118, 120, 122. 124, and 126 over IOLIV line 188, IOCIWD line 190, IOCIV line 192. IOCOWD line 194, and IOCOV line 196, wherein they are combined with reference currents $I_{ref1}$ to $I_{ref5}$, respectively. The other input terminals of comparators 118–126 are connected to VREF line 134.

FIG. 4 is a schematic diagram of L2 current-generating circuit 102. L2 current-generating circuit 102 comprises an L2 voltage-to-current converter circuit 192, an L2/CI differencing circuit 194, an L2/CO differencing circuit 196, and an L2/L1 differencing circuit 198. L2 voltage-to-current converter circuit 192 transfers the reference voltage on VREF line 134 to L2 line 142 for creating the IL2 current which is mirrored, inverted and used to calculate the current differences. L2/CI difference circuit 194 generates an $\overline{IL2}$ current which represents the inverted IL2 current at an $\overline{IL2}$/CI output node 211; L2/CO difference circuit 196 generates an $\overline{IL2}$ current which represents the inverted IL2 current at an $\overline{IL2}$/CO output node 212; and L2/L1 difference circuit 198 generates an $\overline{IL2}$ current which represents the inverted IL2 current at an $\overline{IL2}$/L1 output node 213.

L2 voltage-to-current converter circuit 192 comprises CMOS transistors M104. M107, M105, and M108 for matching the voltage on L2 line 142 with the reference voltage on VREF line 134, and for flowing a proportional current through one of transistors M105 or M108 from VUNREG line 130 to GND line 158, depending on the magnitude and polarity of current flowing on L2 line 142. For example, if the current sense on L2 line 142 is negative (i.e.. flowing to the left on L2 line 142), current flows through transistors M108 and M102. Similarly, if the current sense on L2 line 142 is positive, current flows through transistors M105 and M111. Transistors M102, MI06, and M116 comprise a feedback loop for current flowing through transistors M102 and M108, and transistors M105, M111, and M109 comprise a feedback loop for current flowing through transistors M105 and M111. By virtue of the virtual short existing between L2 line 142 and REF line 134, voltage at node 214 of L2 line 142 is clamped to the voltage at VREF line 134. The current flowing through transistors M108 and M102 is mirrored in transistors MI03, M117, M115, M124, M128, and M130. Similarly, the current flowing through transistors M105 and M111 is mirrored in transistors M112, M120, M123, M127, M129, and M133. Transistors M103, M115 and M128 are relatively large with respect to transistors M102, M117, M124, and M130. For example, the larger transistor may have an integrated circuit width of 300u and a length of 12u, whereas the smaller transistors have a width of 22u and a length of 12u. Similarly transistors M112, M123, and M129 are relatively large with respect to transistors M111, M120, M127, and M133. Transistors M116, M118, M125, M131, M119, M126, and M132 help match the drain voltage of the smaller of the transistors to their respective diode-connected mirroring transistors M102 and M111. For example, transistor M102 has the same current as transistor M117 because they are matched and because transistors M116 and M118 cause the drain voltage of transistors M102 and M117 to match. In like manner, transistors M119, M126, and M132 cause the drain voltages of transistors M120, M123, and M127 to be more closely matched to the drain voltage of diode-connected mirroring transistor M111.

The mirrored current in each difference circuit flows toward or away from $\overline{IL2}/CI$ output node 202, $\overline{IL2}/CI$ output node 206, and $\overline{IL2}/L1$ output node 210, respectively, based on whether current is flowing through the upper or lower portion of the circuit. It should be noted that, in addition to converting the L2 voltage to a proportional current, L2 voltage-to-current converter circuit 192 and difference circuits 194, 196, and 198 also reverse the sense of the IL2 current in the circuit. That is, if the original IL2 current is flowing out of the circuit (to the left along L2 line 142), the mirrored IL2 current flows in the opposite sense toward output nodes 202, 206, and 210. The inverted current then is "added" to the ICI, ICO, and ILI currents flowing into or away from summing nodes 202, 206, and 210, respectively (FIG. 3), and therefore cause the LI, CI, and CO processing circuits to generate a current which represents the difference of each currents pair. That is, the current flowing from CI processing circuit 110 toward $\overline{IL2}/CI$ summing node 202 represents the value of IL2-ICI; the current flowing from CO processing circuit 114 toward $\overline{IL2}/CO$ output node 206 represents the value of IL2-CO. and the current flowing from L1 processing circuit 106 toward $\overline{IL2}/IL1$ summing node 210 represents the value of IL2-IL1.

As noted above, each processing circuit 106, 110, and 114 converts its associated L1, CI, or CO voltage to a corresponding IL1, ICI, or ICO current which is used to create the difference current flowing from or to these modules. Additionally, processing circuits 106, 110, and 114 rectify the difference currents, which are then communicated over lines 188–196 to comparators 118–126, respectively. Each circuit generally operates in the same way, except that L1 processing circuit 106 does not provide an open-wire indication, as do CI processing circuit 110 and CO processing circuit 114. However, the difference in structure is relatively minor as shall be discussed below. Accordingly, only one processing circuit, e.g., CI processing circuit 110, shall be described in detail.

As shown in FIG. 5. processing circuit 110 comprises a CI voltage-to-current converter circuit 220 and an L2/CI difference current rectifier 224. CI voltage-to-current converter circuit 220 has the same structure and operation as L2 voltage-to-current converter circuit 192. That is, it creates a voltage drop across RCI for generating a current which is thereafter communicated to $\overline{IL2}/CI$ summing node 206, wherein the current is combined with the inverted IL2 current to form the L2/CI difference current which flows from or to CI processing circuit 110. Thus, the current flowing through transistors M202, M208, M205 and M211 in this circuit is proportional to the difference between currents IL2 and ICI.

L2/CI difference current rectifier 224 rectifies the L2/CI difference current to ensure that current always flows out of the circuit on IOCIWD line 190 and IOCIV line 192, regardless of the polarity of the L2/CI difference current. That is, the current flowing on IOCIWD line 190 and IOCIV line 192 is equal to /IL2-ICI/. This permits the circuit to be used with both AC and DC voltages. L2/CI difference current rectifier 224 comprises an L2/CI difference current mirror section 228 and a current inverter section 232. Transistors M217, M203, and M218 provide the non-inverted outgoing (IL2-ICI) mirror current for IOCIWD line 190, whereas transistors M223, M215, and M224 provide the non-inverted outgoing (IL2-ICI) mirror current for IOCIV line 192. Transistors M219, M220, and M212 provide the (IL2-ICI) mirror current for current inverter 232 over a line 240.

Current inverter 232 includes transistors M227, M228, M233, M226, and M225 for flowing current from the VUNREG line 130 to GND line 158 in response to the signal received on VREF line 134 and line 240. The current drawn from transistors M227, M228, M226, and M225 is mirrored by transistors M230, M231, M232, M234, M235, and M236. Transistors M230, M231, and M232 flow mirrored current into IOCIWD line 190, and transistors M234, M235, and M236 flow mirrored current into IOCIV line 192.

The only difference between CI processing circuit 110 and L1 processing circuit 106 is the omission of an open-wire line, such as IOCIWD line 190. Thus, L1 processing circuit 106 omits transistors M230, M231, M232, M217, M218, and M203, shown in CI processing circuit 110.

The currents emitted from IOCIWD line 190 and IOCIV line 192 are combined with the respective constant current sources $I_{ref2}$ and $I_{ref3}$, wherein the reference currents combine with the respective currents to form a voltage which varies in response to the difference currents of the circuit being measured. When this voltage matches the reference voltage applied to comparators 120 and 122 over VREF line 134, a signal appears on lines CIWD line 174 and CIVS line 166, respectively. Comparators 118, 124, and 126 operate in the same way.

While the above is a complete description of a preferred embodiment of the present invention, various modifications may be employed. Consequently, the scope of the invention should not be limited except as described in the claims.

I claim:

1. In a circuit for sensing a voltage existing between first and second nodes of the circuit, wherein components comprising the circuit operate from a power supply which generates first and second power supply voltages which comprise ordinary voltage limits of the power supply, an apparatus for sensing voltages between the first and second nodes that may be beyond the voltage limits of the power supply comprising:

first node sensing means for sensing a first input voltage at the first node;

first input voltage converting means, coupled to the first node sensing means, for converting the first input voltage into a first input current;

second node sensing means for sensing a second input voltage at the second node;

second input voltage converting means, coupled to the second node sensing means, for converting the second input voltage into a second input current;

comparing means, coupled to the first input voltage converting means and to the second input voltage converting means, for comparing the first input current to the second input current and for generating a common signal when the first input current exceeds the second input current by a prescribed amount and when the second input current exceeds the first input current by a prescribed amount.

2. The apparatus according to claim 1 wherein the comparing means comprises difference means for comparing the first input current to the second input current and for generating a difference current proportional to the difference between the magnitudes of the first input currents and the second input current.

3. In a circuit for sensing a voltage existing between first and second nodes of the circuit, wherein the components comprising the circuit operate from a power supply which generates first and second power supply voltages which comprises ordinary voltage limits of the power supply, an apparatus for sensing voltages between the first and second nodes that may be beyond the voltage limits of the power supply comprising:

first node sensing means for sensing a first input voltage at the first node;

first input voltage converting means, coupled to the first node sensing means, for converting the first input voltage into a first input current;

second node sensing means for sensing a second input voltage at the second node;

second input voltage converting means, coupled to the second node sensing means, for converting the second input voltage into a second input current;

difference means, coupled to the first input voltage converting means and to the second input voltage converting means, for comparing the first input current to the second input current and for generating a difference current proportional to the difference between the magnitudes of the first input current and the second input current;

a comparator having a first input terminal and a second input terminal;

reference current means, coupled to the difference means and to the first input terminal of the comparator, for adding a reference current to the difference current and for producing a comparator input potential in proportion thereto;

reference potential means, coupled to the second input terminal of the comparator, for providing a reference potential to the second input terminal of the comparator; and wherein the comparator compares the reference potential to the comparator input potential and generates a signal based on the value of the comparator input potential relative to the reference potential.

4. The apparatus according to claim 1 wherein the comparing means includes current coupling means for coupling the first input current and the second input current to a node. termed a "difference node."

5. The apparatus according to claim 4 wherein the first input voltage converting means includes current inverting means for inverting a direction of first input current flow relative to the difference node.

6. The apparatus according to claim 5 wherein the comparing means further comprises:

a comparator having a first input terminal and a second input terminal;

reference current means, coupled to the difference node and to the first input terminal of the comparator, for adding a reference current to the difference current and for producing a comparator input potential in proportion thereto:

reference potential means, coupled to the second input terminal of the comparator, for providing a reference potential to the second input terminal of the comparator: and wherein the comparator compares the reference potential to the comparator input potential and generates a signal based on the value of the comparator input potential relative to the reference potential.

7. The apparatus according to claim 6 wherein the difference current is an alternating current and further comprising rectifying means, coupled to the difference node, for rectifying the current flowing from the difference node and for providing the rectified current to the first input terminal of the comparator.

8. In a circuit for sensing a voltage existing between first and second nodes of the circuit, wherein the components comprising the circuit operate from a power supply which generates first and second power supply voltages which comprise ordinary voltage limits of the power supply, an apparatus for sensing voltages between the first and second nodes that may be beyond the voltage limits of the power supply comprising:

first reference voltage means for providing a first reference voltage;

first node sensing means for sensing a first input voltage at the first node;

first input voltage converting means, coupled to the first node sensing means and to the first reference voltage means, for converting the first input voltage into a first input current;

second node sensing means for sensing a second input voltage at the second node;

second input voltage converting means, coupled to the second node sensing means, for converting the second input voltage into a second input current;

first coupling means, coupled to the first input voltage converting means and to the second input voltage converting means, for coupling the first input current and the second input current to a third node;

wherein the first input voltage converting means flows the first input current in a first direction relative to the third node when the first input voltage is above the reference voltage; and wherein the first input voltage converting means flows the first input current in a second direction relative to the third node when the first input voltage is below the reference voltage.

9. The apparatus according to claim 8 further comprising inverting means, coupled between the first input voltage converting means and the third node, for inverting the direction of the first input current relative to the third node so that the current at the third node is the difference between the first input current and the second input current.

10. The apparatus according to claim 9 further comprising comparing means, coupled to the third node, for generating a signal when the current at the third node exceeds a prescribed value.

11. The apparatus according to claim 10 wherein the comparing means further comprises:

a comparator having a first input terminal and a second input terminal;

reference current means, coupled to the third node and to the first input terminal of the comparator, for adding a reference current to the difference current and for producing a comparator input voltage in proportion thereto;

second reference voltage means, coupled to the second input terminal of the comparator, for providing a second reference voltage to the second input terminal of the comparator; and wherein the comparator compares the second reference voltage to the comparator input voltage and generates a signal based on the value of the comparator input voltage relative to the second reference voltage.

12. The apparatus according to claim 9 further comprising rectifying means, coupled to the third node, for rectifying the current flowing from the third node and for providing the rectified current to a fourth node.

13. The apparatus according to claim 12 wherein the comparing means further comprises:
   a comparator having a first input terminal and a second input terminal;
   reference current means, coupled to the third node and to the first input terminal of the comparator, for adding a reference current to the difference current and for producing a comparator input voltage in proportion thereto;
   second reference voltage means, coupled to the second input terminal of the comparator, for providing a second reference voltage to the second input terminal of the comparator; and
   wherein the comparator compares the second reference voltage to the comparator input voltage and generates a signal based on the value of the comparator input voltage relative to the second reference voltage.

14. In a circuit for sensing a voltage existing between first and second nodes of the circuit, wherein the components comprising the circuit operate from a power supply which generates first and second power supply voltages which comprise ordinary voltage limits of the power supply, an apparatus for sensing voltages between the first and second nodes that may be beyond the voltage limits of the power supply comprising:
   first reference voltage means for providing a first reference voltage;
   first node sensing means for sensing a first input voltage at the first node;
   first input voltage converting means, coupled to the first node sensing means and to the first reference voltage means, for converting the first input voltage into a first input current which varies according to an amount by which the first input voltage exceeds the first reference voltage;
   second node sensing means for sensing a second input voltage at the second node;
   second input voltage converting means, coupled to the second node sensing means, for converting the second input voltage into a second input current; and
   comparing means, coupled to the first input voltage converting means and to the second input voltage converting means, for comparing the first input current to the second input current and for generating a signal when the first input current exceeds the second input current by a prescribed amount.

15. The apparatus according to claim 14 wherein the first input voltage converting means wherein the first input current varies according to an amount by which the first input voltage is less than the first reference voltage.

16. The circuit according to claim 15 wherein the comparing means comprises difference means for comparing the first input current to the second input current and for generating a difference current proportional to the difference between the magnitudes of the first input current and the second input current.

17. The apparatus according to claim 16 further comprising rectifying means, coupled to the difference means, for rectifying the difference current.

18. The apparatus according to claim 17 wherein the comparing means further comprises:
   a comparator having a first input terminal and a second input terminal;
   reference current means, coupled to the rectifying means and to the first input terminal of the comparator, for adding a reference current to the difference current and for producing a comparator input voltage in proportion thereto;
   second reference voltage means, coupled to the second input terminal of the comparator, for providing a second reference voltage to the second input terminal of the comparator; and
   wherein the comparator compares the second reference voltage to the comparator input potential and generates a signal based on the value of the comparator input voltage relative to the second reference voltage.

* * * * *